United States Patent
Sjöland et al.

(10) Patent No.: US 11,335,493 B2
(45) Date of Patent: May 17, 2022

(54) INTEGRATED TRANSFORMER

(71) Applicant: Telefonaktiebolaget LM Ericsson (publ), Stockholm (SE)

(72) Inventors: Henrik Sjöland, Lund (SE); Andreas Axholt, Lund (SE); Christian Elgaard, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 329 days.

(21) Appl. No.: 16/500,117

(22) PCT Filed: Apr. 10, 2017

(86) PCT No.: PCT/EP2017/058532
§ 371 (c)(1),
(2) Date: Oct. 2, 2019

(87) PCT Pub. No.: WO2018/188719
PCT Pub. Date: Oct. 18, 2018

(65) Prior Publication Data
US 2021/0104349 A1    Apr. 8, 2021

(51) Int. Cl.
*H01F 27/28* (2006.01)
*H01F 19/04* (2006.01)
*H03F 3/21* (2006.01)

(52) U.S. Cl.
CPC ......... *H01F 27/2804* (2013.01); *H01F 19/04* (2013.01); *H03F 3/211* (2013.01); *H03F 2200/541* (2013.01)

(58) Field of Classification Search
CPC ...... H01F 27/2804; H01F 19/04; H03F 3/211; H03F 2200/541
(Continued)

(56) References Cited

U.S. PATENT DOCUMENTS

2014/0084700 A1    3/2014    Anderson et al.

FOREIGN PATENT DOCUMENTS

| CN | 101253585 A | 8/2008 |
|---|---|---|
| CN | 102084439 A | 6/2011 |

(Continued)

OTHER PUBLICATIONS

Kaymaksut, Ercan, et al., "Analysis and Optimization of Transformer Based Power Combining for Back-Off Efficiency Enhancement", IEEE Transactions on Circuits and Systems-I: Regular Papers, vol. 60, No. 4, Apr. 2013, pp. 825-835.
(Continued)

*Primary Examiner* — Hafizur Rahman
(74) *Attorney, Agent, or Firm* — Murphy, Bilak & Homiller, PLLC (57) ABSTRACT

An integrated transformer arrangement for combining output signals of multiple differential power amplifiers to a single-ended load. The integrated transformer arrangement comprises a first transformer branch comprising an inductor loop. The inductor loop comprises a set of N windings connected in series. The first transformer branch further comprises a number of primary inductors. Each primary inductor comprises a winding placed concentrically to one winding of the inductor loop, and each primary inductor is configured to couple to a differential output of one of the multiple differential power amplifiers. The integrated transformer arrangement further comprises a secondary inductor comprising a winding placed concentrically to a winding of the inductor loop, and the secondary inductor is configured to couple to the single-ended load.

20 Claims, 8 Drawing Sheets

(58) Field of Classification Search
USPC .......................................................... 330/195
See application file for complete search history.

(56) References Cited

FOREIGN PATENT DOCUMENTS

| | | |
|---|---|---|
| CN | 105720824 A | 6/2016 |
| ES | 2206053 A1 | 5/2004 |

OTHER PUBLICATIONS

Tuffery, A, et al., "CMOS fully integrated reconfigurable power amplifier with efficiency enhancement for LTE applications", Electronics Letters, vol. 51, No. 2, Jan. 22, 2015, pp. 181-182.

INTEGRATED TRANSFORMER

TECHNICAL FIELD

Embodiments herein relate to an integrated transformer arrangement. In particular, they relate to an integrated transformer arrangement for combining output signals of multiple differential amplifiers to a single-ended load, and a power amplifier and an electronic device comprising the integrated transformer arrangement.

BACKGROUND

In modern wireless communication systems, due to a shortage of available spectrum at lower frequencies there is a strong interest in using millimeter or micro waves with high frequencies for high data-rate communication. The use of millimeter waves will thus be an important part of upcoming 5th generation (5G) cellular systems. However, some major challenges must be solved. One of the most important ones is how to achieve sufficient transmit output power at high frequencies using low cost semiconductor technologies, such as Complementary Metal Oxide Semiconductor (CMOS). Although the speed of CMOS devices in the latest technologies is sufficient for implementing millimeter wave amplifiers, the supply voltage is severely limited. It is therefore difficult to obtain high output power. This is addressed by power combination, where outputs of a number of smaller amplifiers are combined to a single output signal. In this way substantially higher output power can be achieved compared to that of a single power amplifier.

Figure 1:
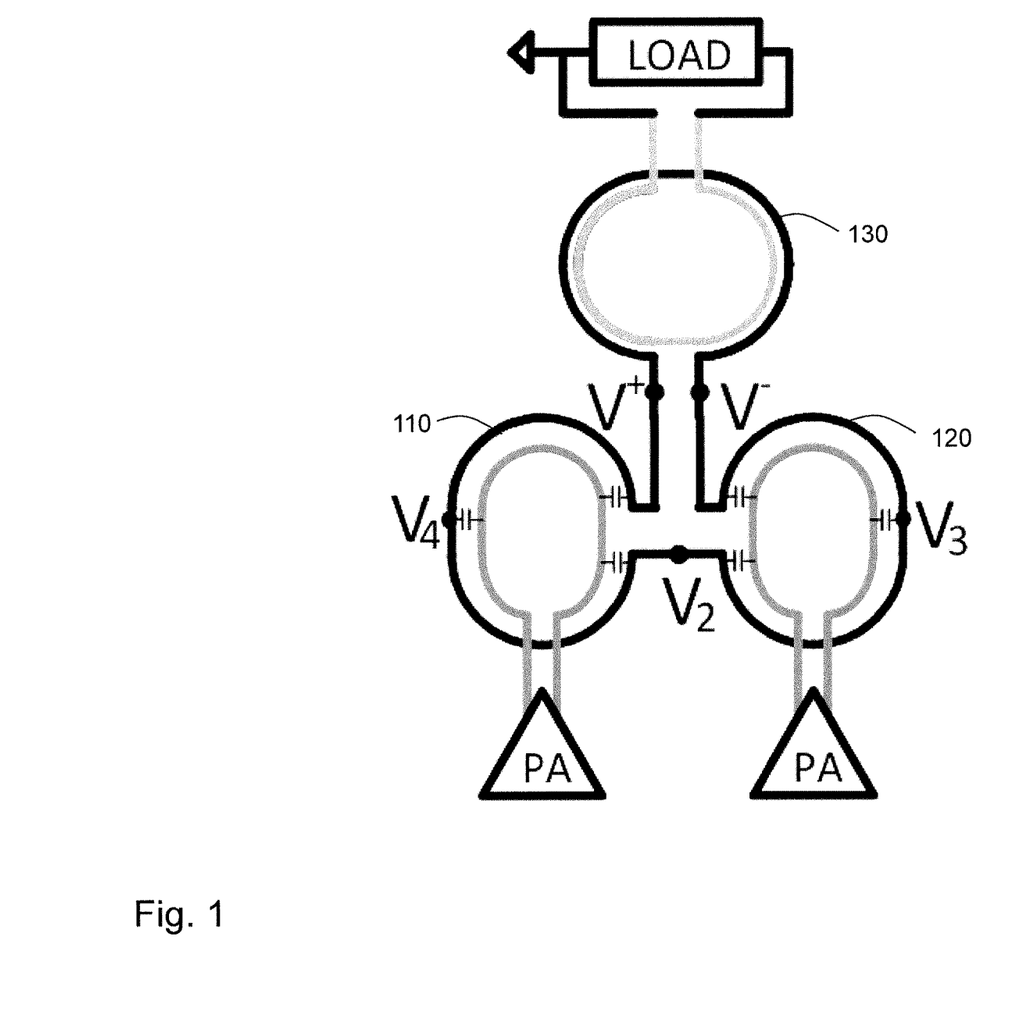
FIG. 1 is a schematic view of a combination network according to prior art.

A key part of a high performance millimeter wave power amplifier in low cost technology is combining network. A combining network should be able to both combine output powers or signals of several power amplifiers with very low loss and show same impedance to all incoming signals. If the impedance of the combining network seen by the power amplifiers is different, the power amplifiers will not be able to deliver the same output power. Then some of the power amplifiers will be subjected to higher voltages than others, which will cause reliability concerns. In addition, distortion generation will also increase. A key problem in the combination network is that balun functionality is needed. This is due to that power amplifiers integrated on a chip are preferably in differential structure and output differential signals, while a single-ended signal to an antenna is typically desired. The balun functionality unfortunately makes it difficult to obtain impedance balance. While combination networks based on transformers have been demonstrated with low loss and balun functionality, the important property of impedance balance is still missing. FIG. 1 shows such a combination network, presented in A. Tuffery, et. al, "*CMOS fully integrated reconfigurable power amplifier with efficiency enhancement for LTE applications*", Electronics Letters, Vol. 51, Issue 2, pp. 181-183, 2015. As shown in FIG. 1, the combination network has two identical transformers 110, 120 for two power amplifiers (PA), with a load balun 130 connected in between. V2 is a symmetry point, resulting in significant common-mode signal voltage in the PA transformer secondary windings. The capacitors shown in FIG. 1 are parasitic capacitors between the primary and secondary windings, i.e. inter-winding parasitic capacitance. When a common-mode signal voltage is present, an impedance imbalance may occur due to the inter-winding parasitic capacitance.

SUMMARY

Therefor it is an object of embodiments herein to provide an integrated combining network with improved performance for combining output signals of multiple differential power amplifiers.

According to one aspect of embodiments herein, the object is achieved by an integrated transformer arrangement for combining output signals of multiple differential amplifiers to a single-ended load. The integrated transformer arrangement comprises a first transformer branch. The first transformer branch comprises an inductor loop comprising a set of N≥3 windings. Each winding comprises a first internal node, a second internal node, a third internal node, and a fourth internal node. Each winding further comprises a first half winding connected between the first internal node and the third internal node; a second half winding connected between the second internal node and the fourth internal node. Further, the N set of windings are connected in such a way that the first internal node and the second internal node of the 1st winding are interconnected, the third internal node and the fourth internal node of the Nth winding are interconnected, and the first internal node and the second internal node of the jth winding, 2≤j≤N, are connected to the third internal node and the fourth internal node, respectively, of the (j−1)th winding.

The first transformer branch further comprises a number of primary inductors. Each primary inductor comprises a winding placed concentrically to one winding of the inductor loop, and each primary inductor is configured to couple to a differential output of one of the multiple differential amplifiers.

The integrated transformer arrangement further comprises a secondary inductor comprising a winding placed concentrically to a winding of the inductor loop, and the secondary inductor is configured to couple to the single-ended load.

In other words, according to some embodiments herein, the inductor loop and the number of primary inductors in the first transformer branch form a number of series connected transformers to combine output signals from a number of the differential power amplifiers; the secondary inductor together with a winding of the inductor loop form a balun transformer that transforms a balanced signal to an unbalanced signal. In this way, a symmetrical impedance is achieved when combining output signals from the differential power amplifiers. This is due to that the number of series connected transformers may be arranged along a line, either horizontal or vertical, such that the first half winding of each winding in the inductor loop is symmetrical to its second half winding about the line. In this way, it is ensured that voltage of the inductor loop is symmetric with respect to the symmetry line. That is, for each winding of the inductor loop, a signal voltage at a point on the first half winding is accompanied by an opposite signal voltage at a corresponding point on the second half winding. Summing the voltage of any winding of the inductor loop, the result is then zero, as a voltage at one half winding on the one side of the line is cancelled by the opposite voltage on the other half winding. The common mode voltage is then zero or close to zero, resulting in no or close to no difference in impedance between the differential PA inputs. When a common-mode signal voltage is present, an impedance imbalance occurs due to the inter-winding capacitance between the winding of the primary inductors and the winding of the inductor loop.

The integrated transformer arrangement is scalable to a different number of power amplifiers per branch, and to a different number of branches. That is an arbitrary number of transformers can be connected in series in a transformer branch, and more than one branch may be combined with a very compact layout.

Therefore, the integrated transformer arrangement according to embodiments herein provides a combiner network with low loss which converts the differential outputs of the power amplifiers to a single-ended load.

BRIEF DESCRIPTION OF THE DRAWINGS

Examples of embodiments herein are described in more detail with reference to attached drawings in which.

DETAILED DESCRIPTION

Figure 2:
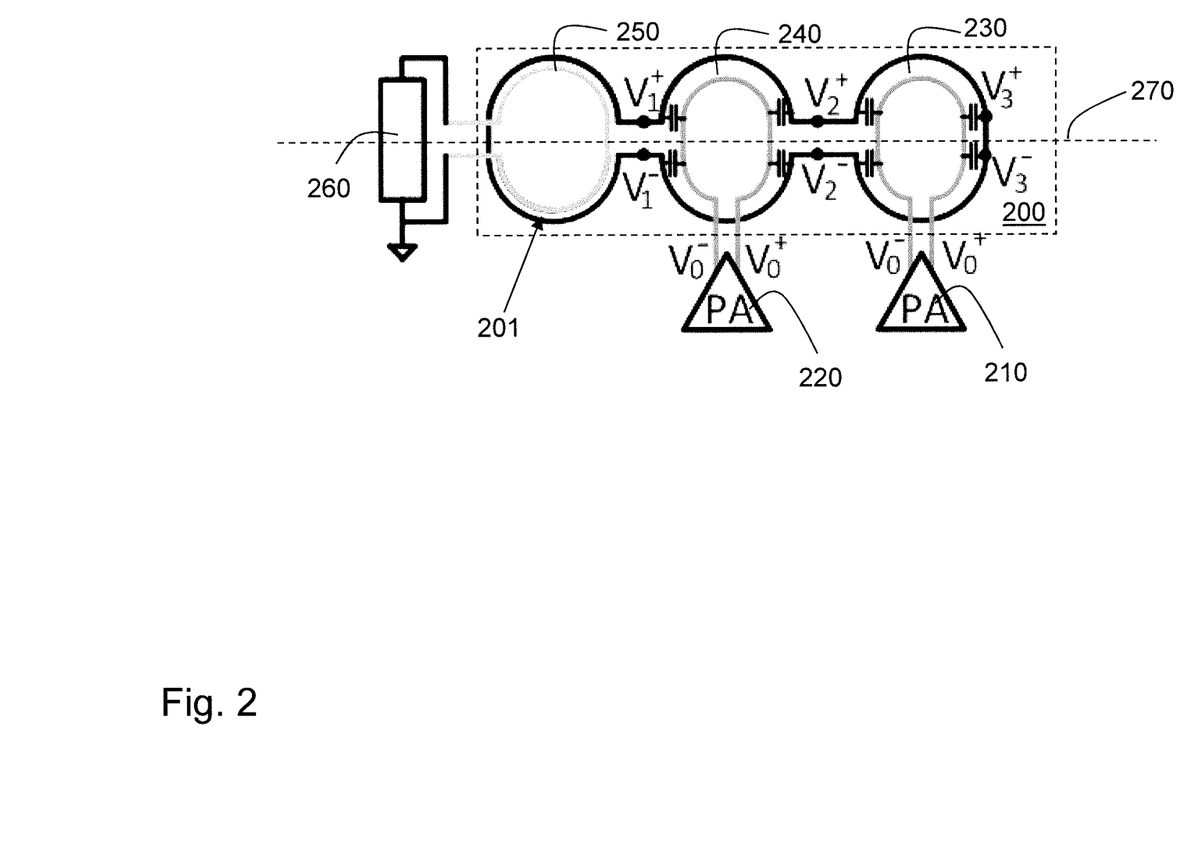
FIG. 2 is a schematic view of a combiner network according to embodiments herein.

To achieve a power combiner with low loss and balun functionality, where all input terminals have the same impedance, an example power combiner structure is outlined in FIG. 2 according to embodiments herein.

The power combiner 200 in FIG. 2 may be used to combine the outputs of two differential power amplifiers 210, 220 into a single-ended output. This is the same basic functionality as that of the combiner shown in FIG. 1. To perform this functionality, the power combiner 200 features three transformers 230, 240, 250. Transformers 230, 240 are coupled to power amplifiers 210, 220, respectively. Transformer 250 has balun function and is coupled to the load 260.

Figure 3:
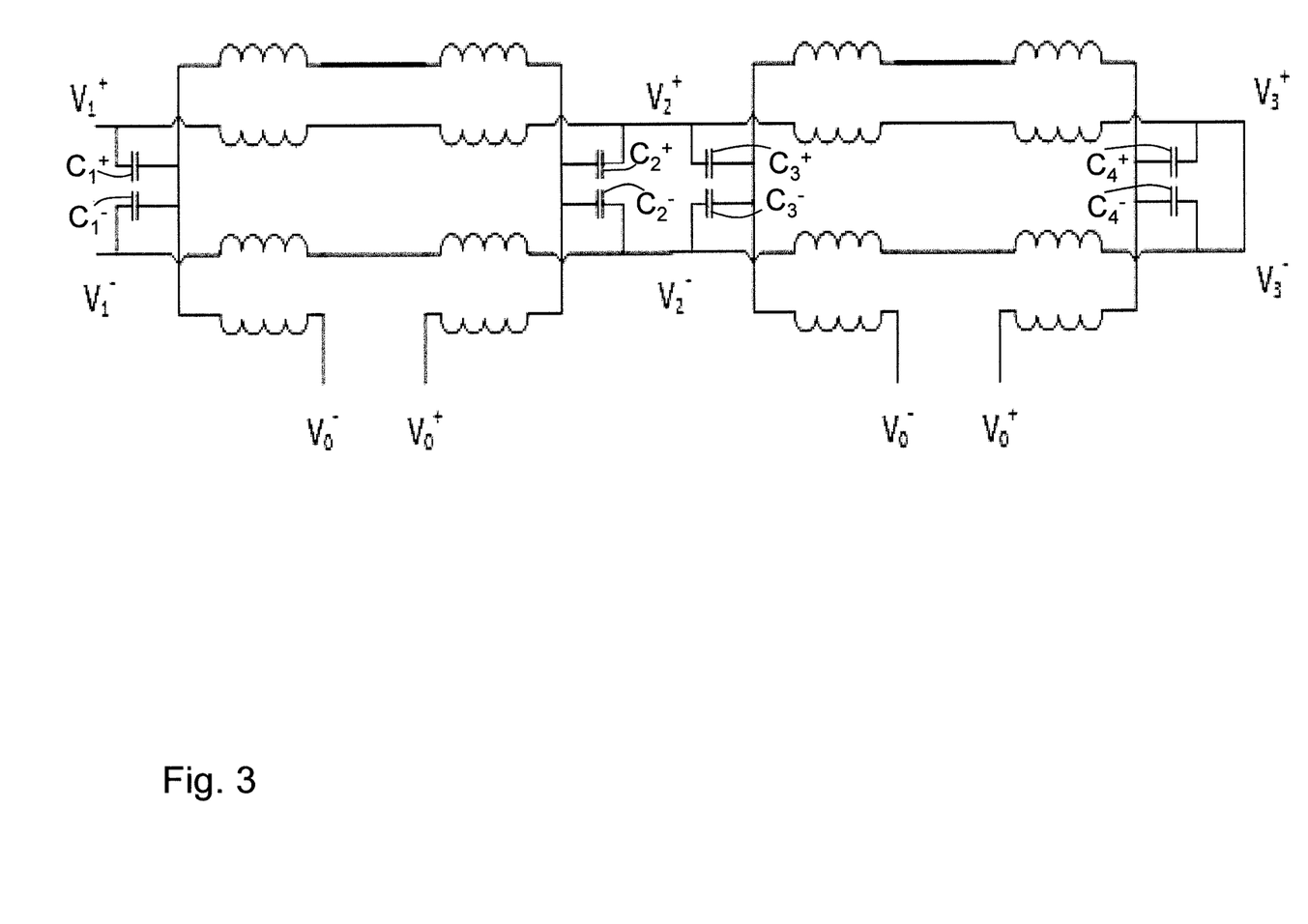
FIG. 3 is a schematic view illustrating a circuit model of the combiner network in FIG. 2.

To analyze and illustrate functionality and advantage of the power combiner 200 in FIG. 2, a schematic model 300 of the power combiner 200 is shown in FIG. 3. The schematic model 300 only shows the model of transformers 230, 240 without the balun 250 and load 260. The capacitors C1, C2, C3, C4 in FIG. 3 are inter-winding capacitance between the primary and secondary windings of the transformers 230, 240 shown in FIG. 2. Here it is clearly seen that the coupling from $V_1^+$ via capacitor $C_1^+$ on the positive side is cancelled by coupling from $V_1^-$ via capacitor $C_1^-$ on the negative side to the primary winding of the transformer. Therefore the power combiner 200 has very nice property of leakage cancellation between the primary and secondary windings.

The power combiner 200 in FIG. 2 combines output power from the power amplifiers 210, 220 in a manner where the load balun 250 is placed beside the PA transformers 230, 240. The transformers 230, 240, 250 are connected in series and arranged along a line, here a horizontal line 270. The principle of this structure is that the voltage of the black trace, i.e. an inductor loop 201 formed by the windings of the transformer 230, 240, 250, is symmetric with respect to the horizontal line 270. That is a signal voltage at a point on the upper half, e.g. $V_1^+, V_2^+, V_3^+$, is accompanied by the opposite polarity signal voltage at the corresponding point on the lower half, e.g. $V_1^-, V_2^-, V_3^-$. Summing the voltage of one winding of the inductor loop 201, the result is then zero, as a voltage at the top half is always cancelled by the opposite voltage on the bottom half. The common mode voltage is then zero, resulting in no difference in impedance between the differential PAs inputs $V_o^+, V_o^-$. When a common-mode signal voltage is present, an impedance imbalance occurs due to the inter-winding capacitance. This happens in the structure of FIG. 1, where $V_2$ is a symmetry point, resulting in significant common-mode signal voltage in the PA transformer secondary windings.

Some non-symmetry may occur also in the structure of FIG. 2, but it may be made small enough not to affect the power amplifier performance. This may occur due to the common-mode voltage inevitably existing on the load side of the load balun 250. The situation may be helped by rotating the secondary winding of the balun 250 by 90 degrees. That is the output port of the transformer 250 may be directed upwards or downwards instead of to the side. Also combining output powers from the power amplifiers may be done with the load balun 250 placed in between the PA transformers.

Figure 4:
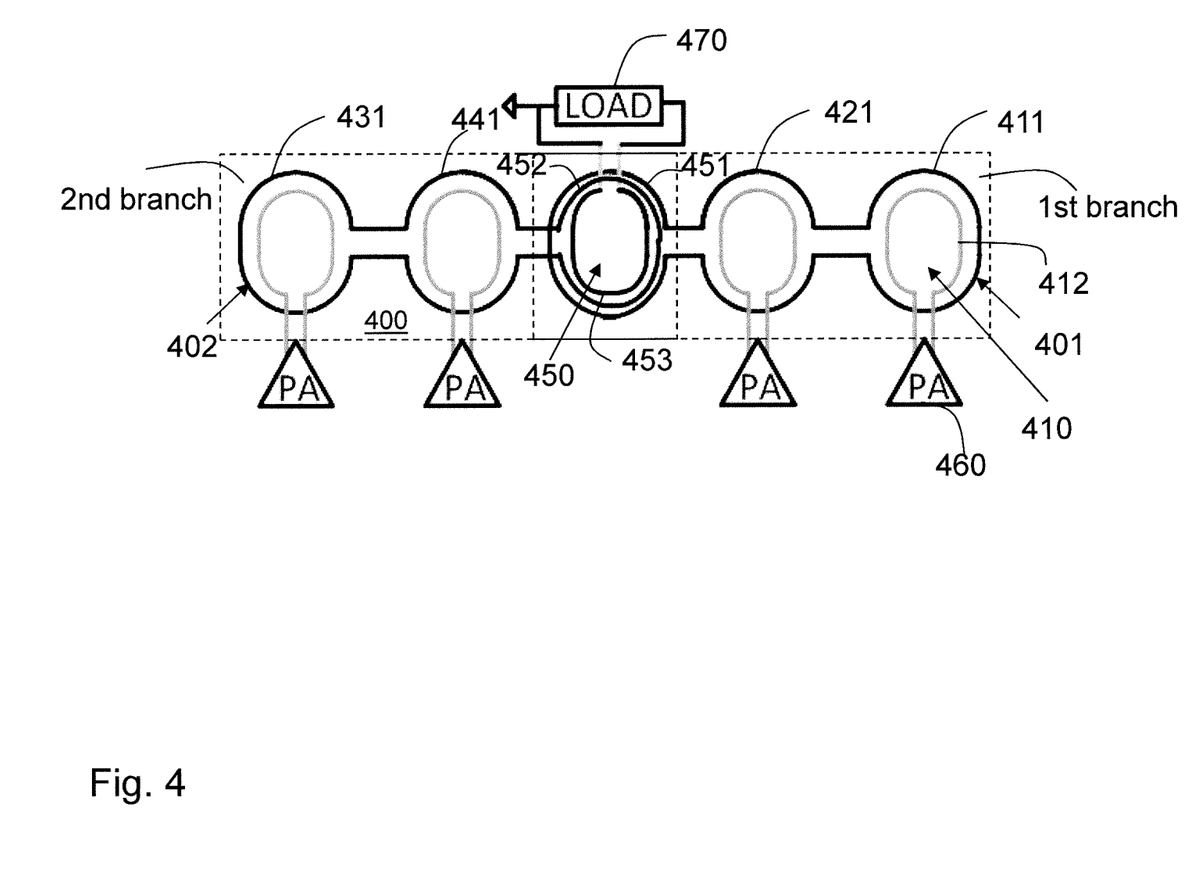
FIG. 4 is a schematic view illustrating a combiner network according to embodiments herein.

FIG. 4 shows such a combiner network 400 featuring combination of two branches of power amplifiers.

In FIG. 4, there are two PA transformer branches connected in parallel. Each transformer branch comprises an inductor loop 401, 402. Each inductor loop 401, 402 comprises a set of N windings, here N=3. For example, the inductor loop 401 comprises windings 411, 421, 451, and the inductor loop 402 comprises windings 431, 441, 452. The two transformer branches are connected in parallel in such a way that the last winding 451 of the inductor loop 401 of the first transformer branch is placed concentrically to the last winding 452 of the inductor loop 402 of the second transformer branch.

Each transformer branch further comprises a number of primary inductors. Each primary inductor comprises a winding placed concentrically to one winding of the inductor loop. For example, a winding 412 of a primary inductor in the first transformer branch is placed concentrically to the winding 411 of the inductor loop 401, thereby the winding 411 of the first inductor loop 401 and the primary inductor winding 412 form a transformer. Each primary inductor is coupled to a differential output of one of multiple differential power amplifiers. For example, the primary inductor winding 412 is coupled to differential outputs of a differential power amplifier 460.

The combiner network 400 further comprises a secondary inductor comprising a winding 453. The secondary inductor winding 453 is coupled to a single-ended load 470. A load balun or transformer 450 is thereby formed by placing the secondary inductor winding 453 concentrically to the two said last windings 451, 452 of the two inductor loops 401, 402.

Here terminology such as "primary inductor" and "secondary inductor" are used to differentiate the two windings in a transformer and should not be considered to limit the scope of the embodiments herein. The "primary" side of the transformer is usually the side that takes power, e.g. the primary inductor winding 412 takes power from PA 460. The "secondary" is usually the side that delivers power, e.g. the secondary inductor winding 453 delivers power to the load. The winding 451 in the first inductor loop 401 may be considered as a primary inductor winding compared to the secondary inductor winding 453, as it takes power from both windings 411, 421 in the first transformer branch. The same may apply to the winding 452 in the second inductor loop 402.

Figure 5:
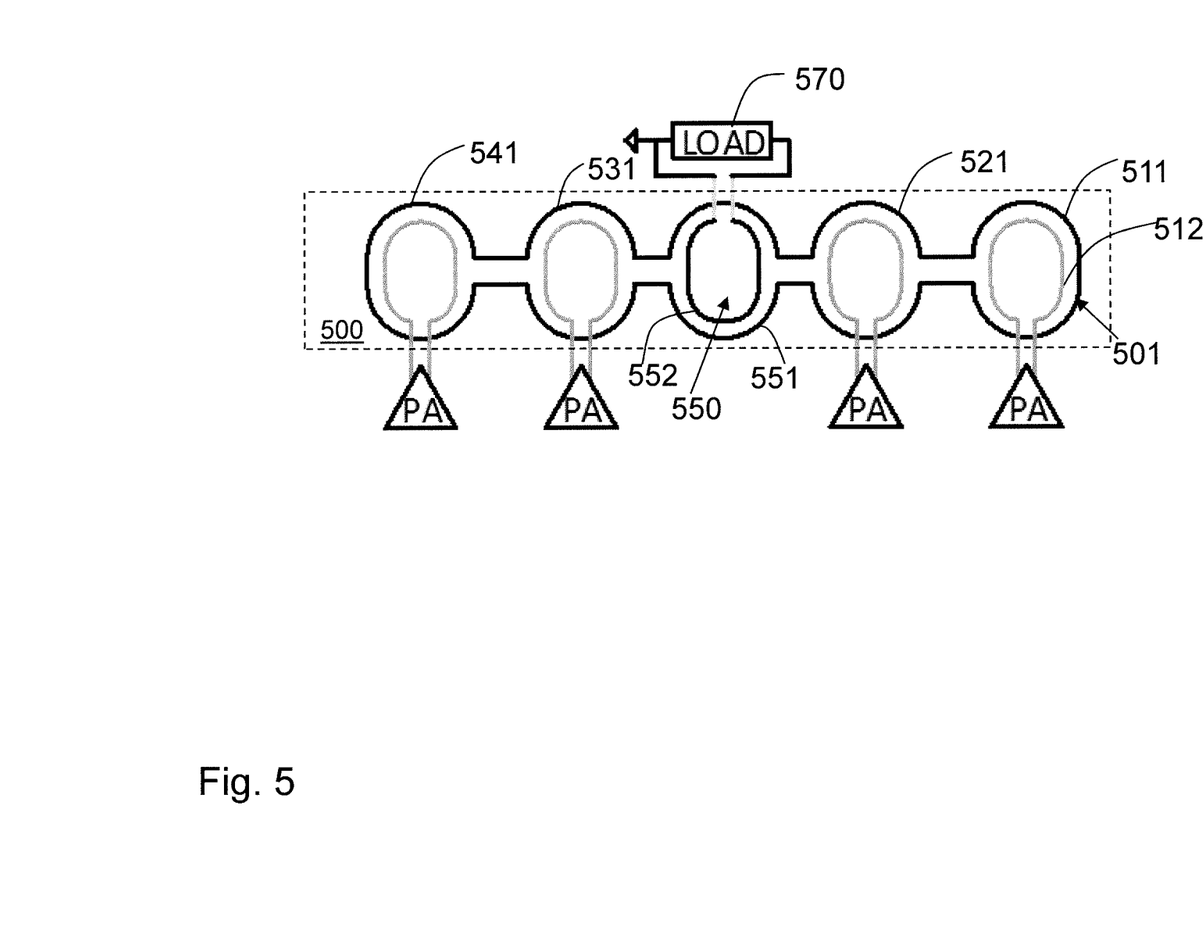
FIG. 5 is a schematic view illustrating a combiner network according to embodiments herein.

FIG. 5 shows another example of a combiner network 500 according to embodiments herein. In FIG. 5, two transformer branches are connected in series by a load balun 550. It may also be seen as two transformer branches merged to one transformer branch comprising a number of PA transformers and a centrally located balun 550. Although the load balun 550 shown in FIG. 5 is placed in the middle of the transformer branch, it may be placed at any other place along the transformer branch.

The transformer branch comprises an inductor loop 501 comprising a set of N windings 511-551, i.e. N=5.

The transformer branch further comprises a number of primary inductors. Each primary inductor comprises a winding, e.g. winding 512, placed concentrically to one winding of the inductor loop 501, e.g. the winding 511. The number of primary inductors and the set of windings in the inductor loop 501 thereby form a number of transformers coupled to a number of differential amplifiers.

The combiner network 500 further comprises a secondary inductor comprising a winding 552. The secondary inductor winding 552 is coupled to a single-ended load 570. A load balun or transformer 550 is thereby formed by placing the secondary inductor winding 552 concentrically to one winding, e.g. the winding 551, of the inductor loop 501.

The combiner network 200, 400, 500 according to embodiments herein is easily scalable to a different number of power amplifiers per branch, and to a different number of transformer branches. That is an arbitrary number of transformers can be connected in series in a transformer branch, and more than one transformer branch may be combined with a very compact layout.

Figure 6:
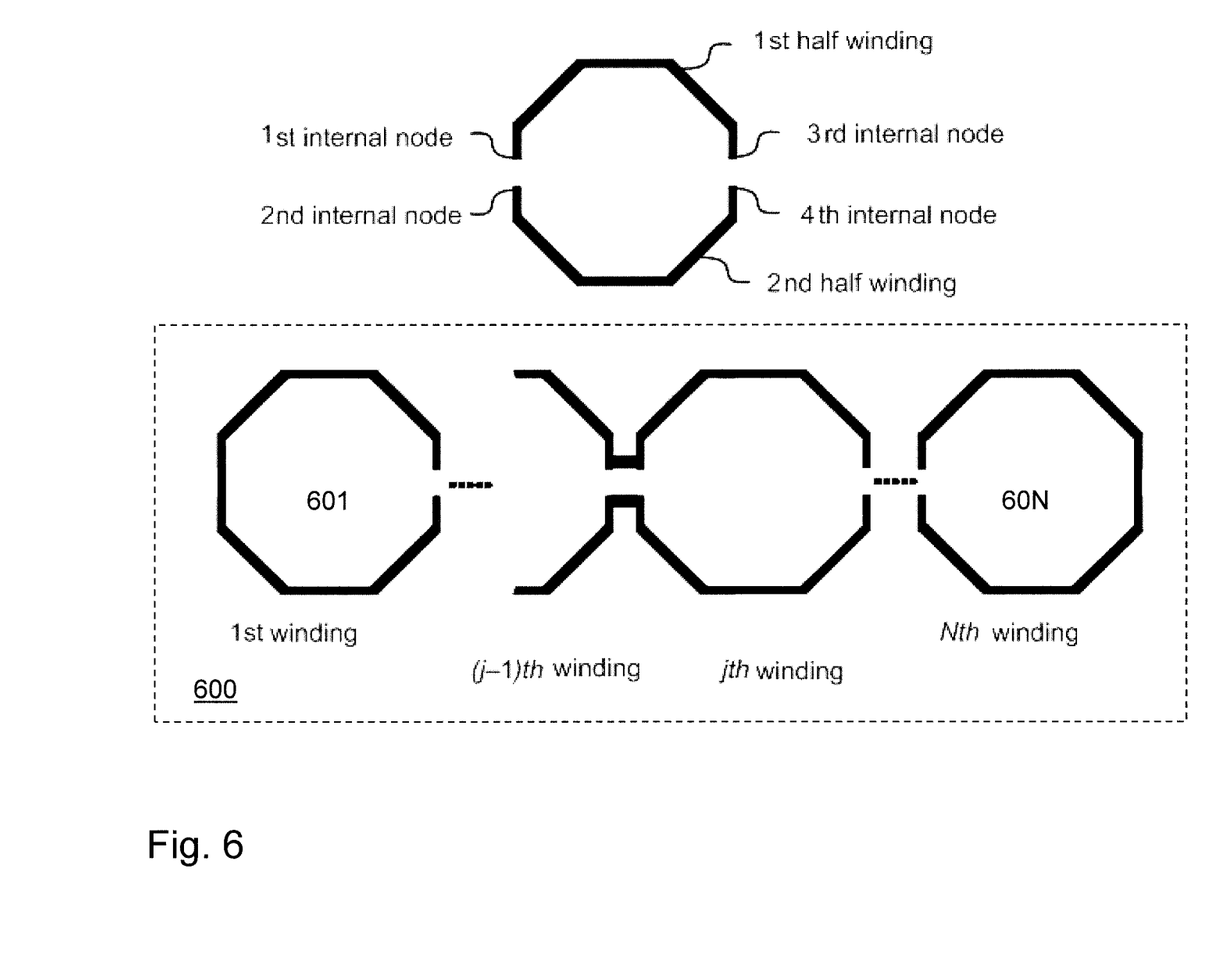
FIG. 6 is a schematic view illustrating an inductor loop according to embodiments herein.

FIG. 6 shows an inductor loop 600 comprising a set of N windings which may be implemented in a transformer branch according to embodiments herein.

Each winding comprises a first internal node, a second internal node, a third internal node, and a fourth internal node.

Each winding has a first half winding connected between the first internal node and the third internal node, and a second half winding connected between the second internal node and the fourth internal node.

The N set of windings is connected in the following ways:
the first internal node and the second internal node of the 1st winding are interconnected;
the third internal node and the fourth internal node of the Nth winding are interconnected;
the first internal node and the second internal node of the jth winding, 2≤j≤N, are connected to the third internal node and the fourth internal node, respectively, of the (j−1)th winding. This can be seen as that the 2nd winding to the (N−1)th winding in the middle of the inductor loop have input/output ports on two sides, as shown on top of FIG. 6, which enable all windings to be connected in series.

In this way, the set of N windings is interconnected and formed to an inductor loop. The inductor loop together with a number of primary inductors and one secondary inductor can constitute a number of transformers as discussed above with reference to FIGS. 4 and 5.

The power combiner network 200, 400, 500 and the inductor loop 600 may be implemented on a chip as an integrated transformer arrangement for combining output signals of multiple differential power amplifiers to a single-ended load.

Therefore, according to embodiments herein, the integrated transformer arrangement comprises a first transformer branch.

The first transformer branch comprises an inductor loop comprising a set of N≥3 windings.

Each winding comprises a first internal node, a second internal node, a third internal node, and a fourth internal node. A first half winding connected between the first internal node and the third internal node, and a second half winding connected between the second internal node and the fourth internal node.

The first internal node and the second internal node of the 1st winding are interconnected. The third internal node and the fourth internal node of the Nth winding are interconnected.

The first internal node and the second internal node of the jth winding, 2≤j≤N, are connected to the third internal node and the fourth internal node, respectively, of the (j−1)th winding.

The first transformer branch further comprises a number of primary inductors, wherein each primary inductor comprises a winding placed concentrically to one winding of the inductor loop, and each primary inductor is configured to couple to a differential output of one of the multiple differential power amplifiers.

The integrated transformer arrangement further comprises a secondary inductor comprising a winding placed concentrically to a winding of the inductor loop, and the secondary inductor is configured to couple to the single-ended load.

With the structure of the integrated transformer arrangement as described above, the inductor loop and the number of primary inductors in the first transformer branch form a number of series connected transformers to combine output signals from a number of the differential power amplifiers; the secondary inductor together with a winding of the inductor loop form a balun transformer that transforms a balanced signal to an unbalanced signal.

According to some embodiments herein, the integrated transformer arrangement may comprise a second transformer branch coupled in parallel with the first transformer branch. The second transformer branch comprises an inductor loop comprising a set of M windings and a number of primary inductors, where M=3, 4 . . . . The M windings are arranged and connected in a similar way as the N windings of the inductor loop in the first transformer branch. M may be the same as N or not. The M windings and the number of primary inductors in the second transformer branch may be arranged in a similar structure as the first transformer branch. The Nth winding of the inductor loop of the first transformer branch is placed concentrically to the Mth winding of the inductor loop of the second transformer branch, and wherein the winding of the secondary inductor coupled to the single-ended load is placed concentrically to the said Nth and Mth windings. The combiner network 400 discussed above with reference to FIG. 4 is a specific example of an integrated transformer arrangement comprising two transformer branches coupled in parallel, where N=M=3.

Although shown in FIGS. 2, 4, 5 and 6, the windings of the inductor loop 201, 401, 501, 600, and the windings of the primary and secondary inductors comprise only one turn, according to some embodiments herein the windings of any inductors may comprise one or more turns.

As shown in FIGS. 2, 4, 5 and 6, although the number of transformers is arranged along a horizontal line, they may be arranged along a vertical line, or along a line in any direction. Further the line may not necessarily be a straight line along all transformers, any other type of lines, e.g. a curved line, a staircase line, will work as well as long as the first half winding of each winding in the inductor loop is symmetrical to its second half winding about the line.

The terminology "placed concentrically to" used above is to describe the psychical relationship or relative position between two windings in a transformer. When the power combiner network 200, 400, 500 is implemented on a chip as an integrated transformer arrangement, two windings placed concentrically to each other may be implemented in different ways. If the same metal layer is used for both primary and second windings, one winding may be placed inside or outside the other winding. If different metal layers are used for two windings, one winding may be placed above or below the other winding.

In order to show the performance of the power combiner network or integrated transformer arrangement 200, 400, 500 according to embodiments herein, some simulations have been performed. In these simulations, a multi-segment transformer model was used to capture the effect of the distributed capacitance. A small-signal simulation was performed to investigate impedance balance for the power amplifiers at an operation frequency of 20 GHz.

Figure 7:
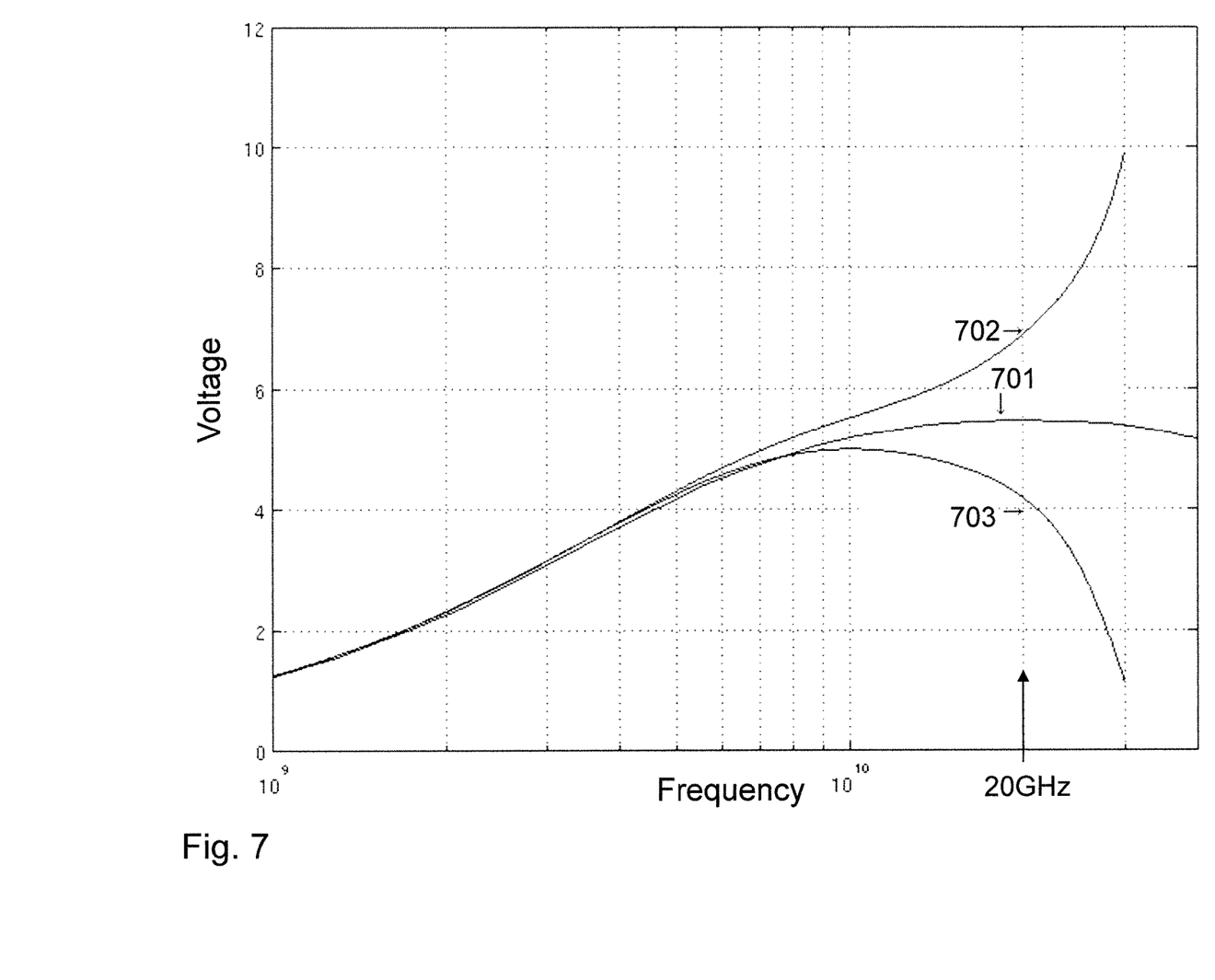
FIG. 7 is a diagram illustrating simulation results.

FIG. 7 shows voltages at PA outputs versus frequency for the prior art power combiner shown in FIG. 1 and the proposed solution shown in FIG. 2. The curve 701 in the middle shows the simulation result of the positive and negative output voltages of one power amplifier, e.g. PA 220 in the power combiner network or integrated transformer arrangement 200 shown in FIG. 2, where no voltage difference between the plus and minus terminal of the PA outputs is noticed. Therefore, impedance at the outputs of any one of the power amplifiers PA 220, 210 is balanced. In contrast, for the prior art power combiner shown in FIG. 1, the voltages at the plus and minus terminals of the PA outputs differ by about 63% at 20 GHz, shown by curves 702 and 703, which means impedance imbalance occurs at the outputs of any one of the two power amplifiers. The voltages shown in FIG. 7 varies with frequency since the impedances of the combiner, both in prior art and the proposed solution, are frequency dependent.

To summarize, in the integrated transformer arrangement 200, 400, 500 according to embodiments herein, a number of series connected transformers formed by an inductor loop and a number of primary inductors are used to combine output signals from a number of the differential power amplifiers. A balun transformer formed by a secondary inductor together with a winding of the inductor loop is used to transform a balanced signal to an unbalanced signal. In this way, symmetrical impedance is achieved when combining output signals from the differential power amplifiers. An arbitrary number of transformers can be connected in series in a branch, which is enabled by windings in the inductor loop that have input/output ports on two sides. The primary inductors coupled to the power amplifiers may be rotated, e.g. by 90 degrees, compared to the respective windings in the inductor loop so that they can have input ports on a side that provides easy access for the power amplifiers. More than one transformer branch may be combined, for instance, using a load transformer or balun with a winding that used as both balun and combiner. In this way, two or more branches may be used with a very compact layout.

Figure 8:
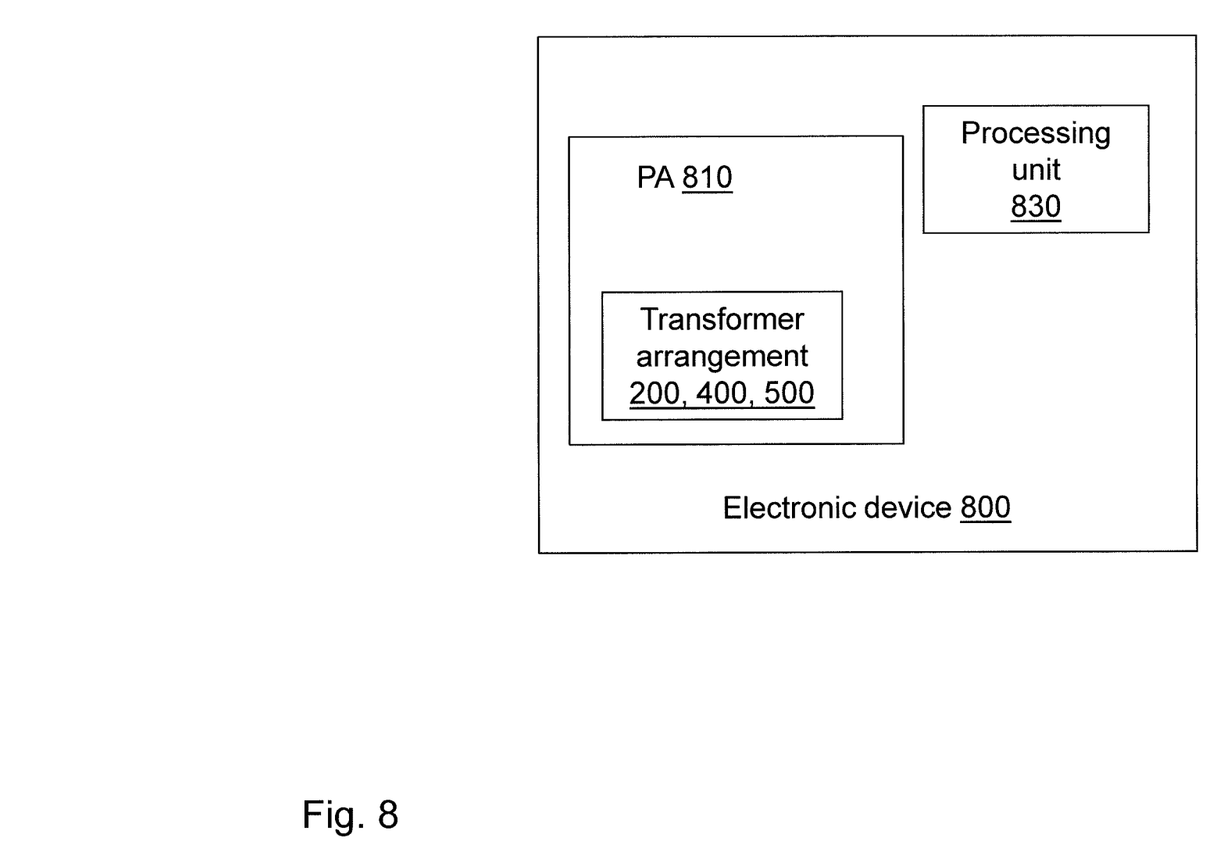
FIG. 8 is a block diagram illustrating an electronic device in which embodiments herein may be implemented.

The integrated transformer arrangement 200, 400, 500 according to the embodiments herein may be employed in various electronic devices. FIG. 8 shows a block diagram for an electronic device 800. The electronic device 800 comprises a power amplifier PA 810, in which the integrated transformer arrangement 200, 400, 500 may be implemented. The electronic device 800 may be a user equipment or a mobile device, a base station or multi-antenna systems in a radio base station, a transmitter, a transceiver etc. in a cellular communications network. The electronic device 800 may comprise other units, where a processing unit 830 is shown.

Those skilled in the art will understand that the integrated transformer arrangement 200, 400, 500 according to embodiments herein may be implemented by any semiconductor technology, e.g. Metal-Oxide-Semiconductor, CMOS or Micro-Electro-Mechanical Systems (MEMS) technology etc.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. An integrated transformer arrangement for combining output signals of multiple differential amplifiers to a single-ended load, wherein the integrated transformer arrangement comprises:
   a first transformer branch, wherein the first transformer branch comprises an inductor loop and a number of primary inductors, wherein the inductor loop comprises a set of N≥3 windings, wherein each primary inductor comprises a winding placed concentrically to one winding of the inductor loop, and wherein each primary inductor is configured to couple to a differential output of one of the multiple differential amplifiers; and
   a secondary inductor that is configured to couple to the single-ended load and that comprises a winding placed concentrically to a winding of the inductor loop;
   wherein each winding of the inductor loop comprises:
   a first internal node, a second internal node, a third internal node, and a fourth internal node;
   a first half winding connected between the first internal node and the third internal node; and
   a second half winding connected between the second internal node and the fourth internal node;
   wherein the first internal node and the second internal node of the 1st winding are interconnected;
   wherein the third internal node and the fourth internal node of the Nth winding are interconnected;
   wherein the first internal node and the second internal node of the jth winding, 2≤j≤N, are connected to the third internal node and the fourth internal node, respectively, of the (j−1)th winding.

2. The integrated transformer arrangement according to claim 1, further comprising a second transformer branch coupled in parallel with the first transformer branch, wherein the second transformer branch comprises an inductor loop comprising a set of M windings connected in series, and a number of primary inductors arranged in a similar structure as the first transformer branch.

3. The integrated transformer arrangement according to claim 2, wherein the Nth winding of the inductor loop of the first transformer branch is placed concentrically to the Mth winding of the inductor loop of the second transformer branch, and wherein the winding of the secondary inductor coupled to the single-ended load is placed concentrically to the said Nth and Mth windings.

4. The integrated transformer arrangement according to claim 1, wherein the winding of any inductor comprises one or more turns.

5. A power amplifier comprising an integrated transformer arrangement for combining output signals of multiple differential amplifiers to a single-ended load, wherein the integrated transformer arrangement comprises:
- a first transformer branch, wherein the first transformer branch comprises an inductor loop and a number of primary inductors, wherein the inductor loop comprises a set of N≥3 windings, wherein each primary inductor comprises a winding placed concentrically to one winding of the inductor loop, and wherein each primary inductor is configured to couple to a differential output of one of the multiple differential amplifiers; and
- a secondary inductor that is configured to couple to the single-ended load and that comprises a winding placed concentrically to a winding of the inductor loop;
- wherein each winding of the inductor loop comprises:
  - a first internal node, a second internal node, a third internal node, and a fourth internal node;
  - a first half winding connected between the first internal node and the third internal node; and
  - a second half winding connected between the second internal node and the fourth internal node;
  - wherein the first internal node and the second internal node of the 1st winding are interconnected;
  - wherein the third internal node and the fourth internal node of the Nth winding are interconnected;
  - wherein the first internal node and the second internal node of the jth winding, 2≤j≤N, are connected to the third internal node and the fourth internal node, respectively, of the (j−1)th winding.

6. The power amplifier according to claim 5, wherein the integrated transformer arrangement further comprises a second transformer branch coupled in parallel with the first transformer branch, wherein the second transformer branch comprises an inductor loop comprising a set of M windings connected in series, M≥3, and a number of primary inductors arranged in a similar structure as the first transformer branch.

7. The power amplifier according to claim 6, wherein the Nth winding of the inductor loop of the first transformer branch is placed concentrically to the Mth winding of the inductor loop of the second transformer branch, and wherein the winding of the secondary inductor coupled to the single-ended load is placed concentrically to the said Nth and Mth windings.

8. The power amplifier according to claim 5, wherein the winding of any inductor comprises one or more turns.

9. An electronic device comprising an integrated transformer arrangement for combining output signals of multiple differential amplifiers to a single-ended load, wherein the integrated transformer arrangement comprises:
- a first transformer branch, wherein the first transformer branch comprises an inductor loop and a number of primary inductors, wherein the inductor loop comprises a set of N≥3 windings, wherein each primary inductor comprises a winding placed concentrically to one winding of the inductor loop, and wherein each primary inductor is configured to couple to a differential output of one of the multiple differential amplifiers; and
- a secondary inductor that is configured to couple to the single-ended load and that comprises a winding placed concentrically to a winding of the inductor loop;
- wherein each winding of the inductor loop comprises:
  - a first internal node, a second internal node, a third internal node, and a fourth internal node;
  - a first half winding connected between the first internal node and the third internal node; and
  - a second half winding connected between the second internal node and the fourth internal node;
  - wherein the first internal node and the second internal node of the 1st winding are interconnected;
  - wherein the third internal node and the fourth internal node of the Nth winding are interconnected;
  - wherein the first internal node and the second internal node of the jth winding, 2≤j≤N, are connected to the third internal node and the fourth internal node, respectively, of the (j−1)th winding.

10. The electronic device according to claim 9, wherein the integrated transformer arrangement further comprises a second transformer branch coupled in parallel with the first transformer branch, wherein the second transformer branch comprises an inductor loop comprising a set of M windings connected in series, M≥3, and a number of primary inductors arranged in a similar structure as the first transformer branch.

11. The electronic device according to claim 10, wherein the Nth winding of the inductor loop of the first transformer branch is placed concentrically to the Mth winding of the inductor loop of the second transformer branch, and wherein the winding of the secondary inductor coupled to the single-ended load is placed concentrically to the said Nth and Mth windings.

12. The electronic device according to claim 9, wherein the winding of any inductor comprises one or more turns.

13. The electronic device according to claim 9, wherein the electronic device is any one of a user equipment, a mobile device, a base station or multi-antenna systems in a radio base station, a transmitter, or a transceiver in a cellular communications network.

14. The integrated transformer arrangement according to claim 1, wherein the number of the multiple differential amplifiers is less than N and wherein the number of the primary inductors is less than N.

15. The integrated transformer arrangement according to claim 1, wherein the winding of the inductor loop that is placed concentrically to the winding of the secondary inductor is not placed concentrically to any of the primary inductors and, together with the winding of the secondary inductor, forms a balun transformer.

16. The power amplifier according to claim 5, wherein the number of the multiple differential amplifiers is less than N and wherein the number of the primary inductors is less than N.

17. The power amplifier according to claim 5, wherein the winding of the inductor loop that is placed concentrically to the winding of the secondary inductor is not placed concentrically to any of the primary inductors.

18. The electronic device according to claim 9, wherein the number of the multiple differential amplifiers is less than N and wherein the number of the primary inductors is less than N.

19. The electronic device according to claim 9, wherein the winding of the inductor loop that is placed concentrically to the winding of the secondary inductor is not placed concentrically to any of the primary inductors.

20. The integrated transformer arrangement according to claim 1, further comprising:
- a second transformer branch coupled in parallel with the first transformer branch, wherein the second transformer branch comprises an inductor loop and a number of primary inductors, wherein the inductor loop of the second transformer branch comprises a set of M≥3 windings connected in series, wherein each primary inductor of the second transformer branch comprises a winding placed concentrically to one winding of the inductor loop of the second transformer branch, and wherein each primary inductor of the second transformer branch is configured to couple to a differential output of one of the multiple differential amplifiers;

wherein the winding of the secondary inductor is placed concentrically also to a winding of the inductor loop of the second transformer branch;

wherein each winding of the inductor loop of the second transformer branch comprises:
- a first internal node, a second internal node, a third internal node, and a fourth internal node;
- a first half winding connected between the first internal node and the third internal node; and
- a second half winding connected between the second internal node and the fourth internal node;

wherein the first internal node and the second internal node of the 1st winding of the inductor loop of the second transformer branch are interconnected;

wherein the third internal node and the fourth internal node of the Nth winding of the inductor loop of the second transformer branch are interconnected;

wherein the first internal node and the second internal node of the jth winding of the inductor loop of the second transformer branch, $2 \leq j \leq N$, are connected to the third internal node and the fourth internal node, respectively, of the (j−1)th winding of the inductor loop of the second transformer branch;

wherein the Nth winding of the inductor loop of the first transformer branch is placed concentrically to the Mth winding of the inductor loop of the second transformer branch, and wherein the winding of the secondary inductor coupled to the single-ended load is placed concentrically to the said Nth and Mth windings.

* * * * *